United States Patent
Alam et al.

(10) Patent No.: US 12,112,067 B2
(45) Date of Patent: Oct. 8, 2024

(54) PERSISTENT xSPI STT-MRAM WITH OPTIONAL ERASE OPERATION

(71) Applicant: Everspin Technologies, Inc., Chandler, AZ (US)

(72) Inventors: Syed M. Alam, Austin, TX (US); Iftekhar Rahman, Chandler, AZ (US); Pedro Sanchez, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 17/884,040

(22) Filed: Aug. 9, 2022

(65) Prior Publication Data
US 2023/0297283 A1  Sep. 21, 2023

Related U.S. Application Data (60) Provisional application No. 63/269,660, filed on Mar. 21, 2022.

(51) Int. Cl.
G06F 3/06 (2006.01)
(52) U.S. Cl.
CPC .......... G06F 3/0659 (2013.01); G06F 3/0604 (2013.01); G06F 3/0652 (2013.01); G06F 3/0673 (2013.01)
(58) Field of Classification Search
CPC .... G06F 3/0659; G06F 3/0604; G06F 3/0652; G06F 3/0673
See application file for complete search history.

(56) References Cited

U.S. PATENT DOCUMENTS

| | | | |
|---|---|---|---|
| 9,973,194 B2 | 5/2018 | Tate et al. | |
| 10,411,711 B2 | 9/2019 | Kozaczuk et al. | |
| 2010/0067293 A1 | 3/2010 | Yu et al. | |
| 2010/0332729 A1* | 12/2010 | Alrod | G06F 12/0246 714/763 |
| 2012/0198313 A1* | 8/2012 | Alam | G06F 11/1048 714/E11.035 |
| 2014/0104963 A1* | 4/2014 | Andre | G11C 7/02 365/189.09 |

(Continued)

FOREIGN PATENT DOCUMENTS

| | | |
|---|---|---|
| CN | 106059567 A | 10/2016 |
| CN | 110532222 A | 12/2019 |

(Continued)

OTHER PUBLICATIONS

B. N. Engel et al., "A 4-Mb toggle MRAM based on a novel bit and switching method," IEEE Trans. Magn., vol. 41, pp. 132-136, Jan. 2005.

(Continued)

*Primary Examiner* — Eric T Loonan
(74) *Attorney, Agent, or Firm* — Bookoff McAndrews, PLLC (57) ABSTRACT

The present disclosure is drawn to, among other things, a method for programming a memory device comprising a plurality of memory arrays. The method may include receiving a command to program one or more of the plurality of memory arrays and programming the one or more of the plurality of memory arrays based on the command. The method may optionally include erasing the one or more of the plurality of memory arrays prior to the programming.

16 Claims, 5 Drawing Sheets

500

502 — RECEIVE A COMMAND TO PROGRAM A DEVICE

504 — OPTIONALLY ERASE THE DEVICE

506 — PROGRAM THE DEVICE BASED ON THE COMMAND AND AFTER OPTIONALLY ERASING THE DEVICE

(56) References Cited

U.S. PATENT DOCUMENTS

| | | | |
|---|---|---|---|
| 2015/0243359 A1* | 8/2015 | Kho | G11C 7/24 |
| | | | 711/103 |
| 2016/0093355 A1* | 3/2016 | Naeimi | G11C 11/1659 |
| | | | 365/158 |
| 2016/0104519 A1* | 4/2016 | Slaughter | G11C 11/1659 |
| | | | 365/158 |
| 2019/0035460 A1* | 1/2019 | Terada | G11C 13/0069 |
| 2020/0213138 A1* | 7/2020 | Mondello | G11C 16/0483 |
| 2020/0273512 A1* | 8/2020 | Petti | G11C 11/1673 |
| 2022/0012190 A1* | 1/2022 | Cheng | G06F 13/4282 |

FOREIGN PATENT DOCUMENTS

| | | | |
|---|---|---|---|
| EP | 1764803 A1 | 3/2007 | |
| EP | 4060666 A1 | 9/2022 | |

OTHER PUBLICATIONS

Everspin Technologies Inc., "Expanded Serial Peripheral Interface (xSPI) Industrial STT-MRAM Persistent Memory," EM064LX datasheet, Mar. 2022, available upon request at www.everspin.com.

GigaDevice, GD25LX256E datasheet, ver1.0, Aug. 5, 2019. https://www.gigadevice.com/datasheet/gd25lx256e/.

Infineon, "256Mb/512Mb/1Gb SEMPER™ Flash Octal interface, 1.8V/3.0V," S28H* datasheet, 002-18216 Rev. *W, Jan. 18, 2022.

JEDEC Standard JESD251B, Expanded Serial Peripheral Interface (xSPI) for Non Volatile Memory Devices, Item 1775.64, Sep. 2021.

Macronix, "1.8V 512M-bit [x1/x8] CMOS OctaFlash Memory," MX25UM51245G datasheet, rev1.4, Apr. 18, 2019.

S. Aggarwal et al., "Demonstration of a reliable 1 Gb standalone spin-transfer torque MRAM for industrial applications," in IEDM Tech. Dig., Dec. 2019, pp. 2.1.1-2.1.4.

S. Ikegawa, F. B. Mancoff and S. Aggarwal, "Commercialization of MRAM—Historical and Future Perspective," 2021 IEEE International Interconnect Technology Conference (IITC), 2021, pp. 1-3, Jul. 2021.

Y.-D. Chih et al., "A 22nm 32Mb Embedded STT-MRAM with 10ns Read Speed, 1M Cycle Write Endurance, 10 Years Retention at 150° C. and High Immunity to Magnetic Field Interference," 2020 IEEE International Solid-State Circuits Conference, 2020, pp. 222-224, Feb. 2020.

Alam, S. M., et al. "Persistent xSPI STT-MRAM with up to 400MB/s Read and Write Throughput." 2022 IEEE International Memory Workshop (IMW). IEEE, Mar. 18, 2022.

European Search Report issued on Aug. 3, 2023 in European Patent Application No. 23163091.4 (11 pages, in English).

Ikegawa, Sumio, et al. "Commercialization of MRAM-Historical and Future Perspective." 2021 IEEE International Interconnect Technology Conference (IITC). IEEE, Jul. 6, 2021.

* cited by examiner

PERSISTENT xSPI STT-MRAM WITH OPTIONAL ERASE OPERATION

CROSS-REFERENCE TO RELATED APPLICATION

This application claims benefit to U.S. Provisional Patent Application No. 63/269,660, filed Mar. 21, 2022, the entire contents of which are incorporated herein by reference.

TECHNICAL FIELD

Embodiments of the present disclosure relate to, among other things, systems and methods for magnetoresistive random-access memory (MRAM) devices, including systems and methods for MRAM devices that support an optional erase operation.

INTRODUCTION

In general, a memory system may include a memory device for storing data and a host (or controller) for controlling operations of the memory device. Memory devices may be classified into volatile memory (such as, e.g., dynamic random-access memory (DRAM), static random-access memory (SRAM), etc.) and non-volatile memory (such as, e.g., electrically erasable programmable read-only memory (EEPROM), ferroelectric random-access memory (FRAM), phase-change memory (PRAM), magnetoresistive memory (MRAM), resistive random-access memory (RRAM/ReRAM), flash memory, etc.).

Serial not-OR (NOR) memory performs page program operation using a large page buffer, e.g., 256 byte buffer for data. However, prior to performing the page program operation, serial NOR memory requires performing an erase operation to a section of the memory which includes the page addressed for programming. Such an erase operation is required as a floating gate bit cell of the serial NOR memory may require writing all floating gates to a particular state prior to conducting a write operation. Thus an erase operation is required prior to performing a program operation in serial NOR memory. Performing an erase operation results in extra write time and resources (e.g., energy) for writing bits in a serial NOR memory.

BRIEF DESCRIPTION OF THE DRAWINGS

In the course of the detailed description that follows, reference will be made to the appended drawings. The drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

Moreover, there are many embodiments of the present disclosure described and illustrated herein. The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein; however, all permutations and combinations are considered to fall within the scope of the present inventions.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

As used herein, the terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. The term "exemplary" is used in the sense of "example," rather than "ideal."

DETAILED DESCRIPTION

Detailed illustrative aspects are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of exemplary embodiments described herein.

When the specification makes reference to "one embodiment" or to "an embodiment," it is intended to mean that a particular feature, structure, characteristic, or function described in connection with the embodiment being discussed is included in at least one contemplated embodiment of the present disclosure. Thus, the appearance of the phrases, "in one embodiment" or "in an embodiment," in different places in the specification does not constitute a plurality of references to a single embodiment of the present disclosure.

As used herein, the singular forms "a," "an," and "the" are intended to include the plural forms as well, unless the context clearly indicates otherwise. It also should be noted that in some alternative implementations, the features and/or steps described may occur out of the order depicted in the figures or discussed herein. For example, two steps or figures shown in succession may instead be executed substantially concurrently or may sometimes be executed in the reverse order, depending upon the functionality/acts involved. In some aspects, one or more described features or steps may be omitted altogether, or may be performed with an intermediate step therebetween, without departing from the scope of the embodiments described herein, depending upon the functionality/acts involved.

Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. It should also be noted that all numeric values disclosed herein may have a variation of ±10% (unless a different variation is specified) from the disclosed numeric value. Further, all relative terms such as "about," "substantially," "approximately," etc. are used to indicate a possible variation of ±10% (unless noted otherwise or another variation is specified).

In one aspect, the present disclosure is directed to techniques and implementations to program storage devices, including, e.g., non-volatile or "permanent" memory capable of maintaining data when a power supply is deactivated (e.g., Flash, MRAMs, or ReRAMs). Though the description below makes reference to MRAMs or ReRAMs memory device cell, the inventions may be implemented in other memory devices including, but not limited to, electrically erasable programmable read-only memory (EEPROM), and/or ferroelectric random-access memory (FRAM).

Serial NOR and/or not-AND (NAND) non-volatile memory require erase operations as the bitcell to be written needs to be erased prior to program operation. An erase operation writes each bitcell in a first state, followed by a program operation that can write each bitcell in a second state. Without writing the first state, second state write is not possible in serial NOR and/or NAND memory.

Additionally, serial static random-access memory (SRAM) volatile memory may not require an erase operation. For example, serial SRAM memory may be configured to write either a state during a program/write command, without an erase operation. However, though serial SRAM may be used to program write commands without an erase operation, serial SRAM is volatile memory, limiting its use accordingly.

Furthermore, an MRAM 1-transistor and 1-MTJ (1T1MTJ) bitcell array is typically arranged in rows and columns. For example, 256 or 512 bitcells in a column may share dedicated bitline (BL) and sourceline (SL) conductors per column. A wordline (WL) may connect to multiple bitcells along the row direction. If the sourceline is placed on lower level metal layers, parasitic resistance can be significant. Therefore, a variation of such a standard sourceline array may include a common sourceline array with two columns sharing a wide horizontal sourceline. In either a standard or common sourceline array, MTJ current flow directions for write 1 and write 0 states may be from the transistor to the MTJ or from the MTJ to the transistor, respectively. For example, write 1 current flow may have voltage (V) equals current (I)*resistance (R) across the MTJ resistance at the source of the select transistor reducing the transistor's gate-to-source voltage. Thus, two different wordline voltage levels may be used for maximum current drive during write 0 and write 1, respectively. In Flash memory, such as non-volatile memory applications with erase and program commands, separately writing 0 and 1 states may resolve the different wordline voltage level issue at the cost of longer write timing. The selected wordline voltage level is driven to a level above VDD to maximize the drive current of the select transistor during writes. Therefore, unselected bitlines along the row need to be elevated to avoid select transistor time-dependent dielectric breakdown (TDDB) stress.

Certain embodiments described herein may solve one or more of the above-described problems. For example, certain embodiments of the disclosed persistent xSPI MRAM device may support execution of a program operation without an erase operation, while being non-volatile, and may provide an alternate bitcell array scheme, such as a local sourceline array, to resolve the write issues identified above. Furthermore, the disclosed persistent xSPI MRAM device may also support an optional erase command. Such an erase command may be optional, and may be executed prior to issuing a write or program command. The xSPI MRAM devices disclosed herein may be non-volatile memory or may include one or more non-volatile memory components.

Additionally, or alternatively, the xSPI MRAM memory disclosed herein may include a non-volatile erase bit value register storing an erase bit value that can be set or reset by a controller. For example, an erase bit value 1 may indicate an erase with a 1 state and an erase bit value 0 may indicate an erase with a 0 state. According to some implementations, the bits may be reversed to indicate the 1 or 0 states. Accordingly, when an optional erase command is activated, the erase bit value (e.g., 1 or 0) may be referenced. The erase operation for the respective bits may be implemented such that the respective bits are programmed to either 1 or 0, based on the erase bit value stored at the non-volatile erase bit value register.

According to an implementation, when the erase bit value is 0, an erase command may write data state 0 to the MRAM memory array. When the bit is set to 1, an erase command may write data state 1 to the MRAM memory array. An erase command can be implemented using either data 1 or 0 write states, depending on the provided erase bit value stored in the non-volatile erase bit value register. A program or write command for the xSPI MRAM memory disclosed herein optionally uses an erase command prior to the program or write command (e.g., the erase command is not required prior to the program or write command). Accordingly, the xSPI MRAM memory provides an option to erase the data in the addressed space(s) prior to issuing a program or write command but does not require erasing the data in the addressed space(s) prior to issuing the program or write command.

As described herein, having an MRAM device configured to optionally perform an erase operation prior to a write or program command may reduce or eliminate operations that need to be performed to program the MRAM device. This may conserve energy that would otherwise be consumed through operations of the MRAM device and/or may reduce latency associated with programming the MRAM device.

Figure 1:
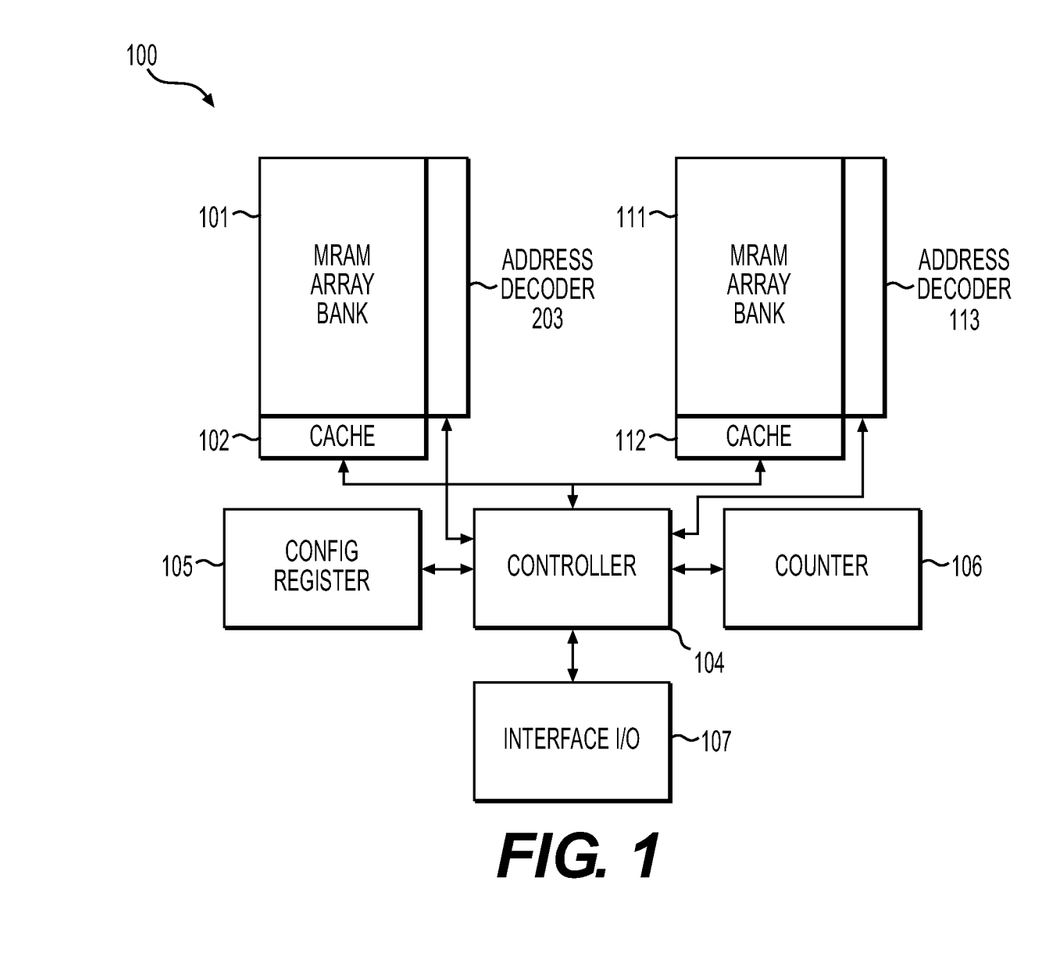
FIG. 1 depicts a functional block diagram of an exemplary MRAM device, according to an aspect of the present disclosure.

FIG. 1 depicts a functional block diagram of an exemplary MRAM device 100, according to an aspect of the present disclosure. The writing speed of an MRAM device 100 may be faster than that of the serial NOR memory device. For instance, writing to a local storage (e.g., cache) of the MRAM device 100 may be performed while simultaneously writing data from the local storage to the main memory array, and the writes to the main memory array may be performed relatively quickly (e.g., compared to NOR memory devices). Therefore, an MRAM device 100 may allow a write operation for data having a size from 1 byte to essentially an infinite number of bytes. Thus, an MRAM device 100 does not have a limitation of performing a page program operation using a page buffer having a set size as in a NOR memory device, because writing to a main memory array may be performed in the background while simultaneously writing to the local storage (e.g., cache). Because the write to the main memory array is fast in an MRAM device 100, the cache size may be kept small (e.g., 256 bits) and the writing to the main memory array may be performed in parallel to the writing to the cache. Additionally, functionality is improved because the controller 104 may stop data transmission into the memory array banks 101, 111 at any time, after 1 byte is written.

As shown in FIG. 1, an MRAM device 100 may include a first memory array bank 101 (illustrated as an MRAM array bank, for example) and a second memory array bank 111. A controller 104 may be connected to a cache 102 and an address decoder 103 of the first memory array bank 101, a cache 112 and an address decoder 113 of the second memory array bank 111, a configuration register 105, a counter 106, and an input/output interface 107 (labeled "interface I/O" in FIG. 1). The memory array banks 101, 111 may be accessed independently from each other for reading and/or writing to any desired address. The caches 102 and 112 may be coupled to memory array banks 101 and 111, respectively, to allow data to be transferred between the memory array banks and the caches. In some embodiments, each of the caches 102 and 112 may include static random access memory (SRAM) memory cells, whereas in some embodiments, the caches 102 and 112 may include registers, flip-flops, or other storage circuits that are used to store data. Caches 102 and 112 may include enough storage to accommodate a page of data from the memory array banks and may also include additional storage to store the address of the page, parity or other error correction code (ECC) information for the page, and any inversion or other information relevant to the page. Example sizes for the caches may include 32-bit and 256-bit, however, example embodiments are not limited to these sizes. The size of the caches and that of the pages accessed can be adapted to suit the needs of the application.

The configuration register 105 (labeled "config register" in FIG. 1) may include at least one configuration register bit that identifies whether the MRAM device 100 is operating in a first mode or a second mode. For example, the configuration register 105 may be a write mode configuration register that indicates whether the MRAM device 100 is being operated in a NOR emulation mode (i.e., NOR Flash Program mode) or a persistent memory mode. The configuration register 105 may be written and/or read through the controller 104 and the interface I/O 107 (e.g., a serial interface connected to the controller 104 for external communication). The configuration register bit may be accessed (e.g., for read or write) by a user via the interface I/O 107. The counter 106 may be used when the configuration register 105 is set to 0 to operate in, e.g., a NOR emulation mode.

The configuration register 105 may be a separate component from an erase bit value register (not illustrated in FIG. 1), which may store a bit value that indicates whether an optional erase operation is to be performed in connection with certain embodiments. Alternatively, in some embodiments, the configuration register 105 and the erase bit value register may be implemented in a combined component. For example, in some embodiments, a single register may be used to store configuration register bits and erase bit values.

The counter 106 may be an address counter used to keep track of information, such as when certain operations should occur. For example, the address counter 106 may include a counter value that is incremented once for each byte that is written. When the counter value reaches the limit, the controller 104 may cause the next byte of data to be written to a starting address, writing over data that was previously written.

The first memory array bank 101 and the second memory array bank 111 may be used together to achieve a high speed serial interface (e.g., 200 MHz or more). With double data rate (DDR), data may be obtained at both the rising edge and falling edge of the clock. With DDR, the first memory array bank 101 may initially be used to write the data. If the first memory array bank 101 is taking too much time to write a page (e.g., 256-bit page), the second memory array bank 111 may be used. For example, the first memory array bank 101 and the second memory array bank 111 may be used independently of each other to improve speed and performance of the MRAM device 100.

Although some embodiments are described herein as relating to a memory array bank, certain embodiments may relate to a memory array. A memory array may include an array of storage elements, e.g., an MRAM bitcell, and associated sensing, write drive, and wordline drive circuitry. Alternatively, a memory array may include just the array of storage elements, e.g., just the MRAM bitcell. A memory bank may include one or more memory arrays which are defined by a common bank address.

Figure 2:
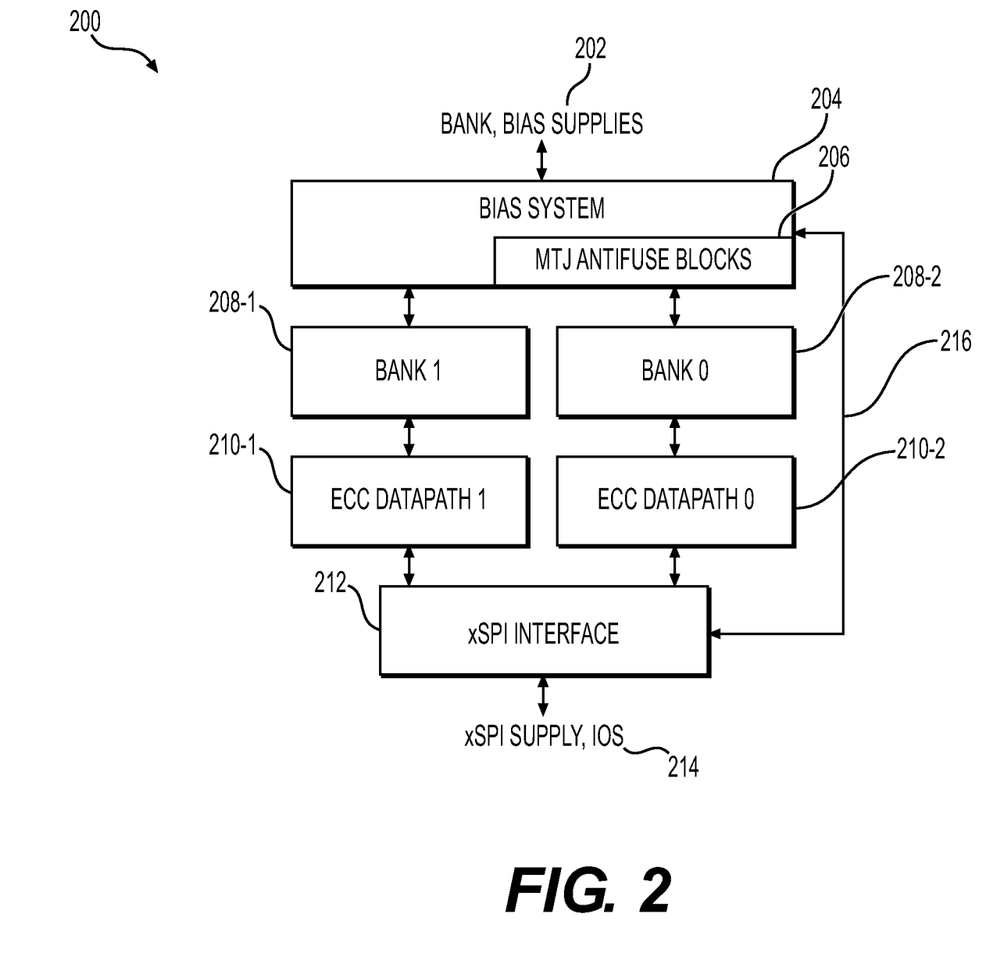
FIG. 2 depicts a functional block diagram of an exemplary expanded serial peripheral interface (xSPI) MRAM device, according to an aspect of the present disclosure.

FIG. 2 depicts a functional block diagram of an exemplary xSPI MRAM device 200, according to an aspect of the present disclosure. For example, the xSPI MRAM device 200 may include a 64 Mb chip or any other size chip. The xSPI MRAM device 200 may include bank and/or bias supplies 202, a bias system 204 connected to the bank and/or bias supplies 202, magnetic tunnel junction (MTJ) antifuse blocks 206 included in the bias system 204, a first memory array bank 208-1 (labeled "Bank 1" in FIG. 2) and a second memory array bank 208-2 (labeled "Bank 0" in FIG. 2) connected to the bias system 204, an error correction code (ECC) datapath 210-1 (labeled "ECC Datapath 1" in FIG. 2) connected to the memory array bank 208-1 and an ECC datapath 210-2 (labeled "ECC Datapath 0" in FIG. 2) connected to the memory array bank 208-2, an xSPI interface 212 connected to the ECC datapaths 210-1 and 210-2, and xSPI supply (e.g., interface supply) and/or inputs/outputs 214 (labeled "IOs" in FIG. 2) connected to the ECC datapaths 210 and connected to the MTJ antifuse blocks 206 and/or the bias system 204.

In some embodiments, the memory array banks 208 may be similar to the memory array banks 101, 111 of FIG. 1, the xSPI interface 212 and/or the IOs may be similar to the interface I/O 107 of FIG. 1. In addition, the xSPI MRAM device 200 may include one or more other components illustrated in FIG. 1, e.g., a controller similar to the controller 104.

An erase bit value register may have a volatile register in the xSPI interface 212 and may have a dedicated MRAM bit register for non-volatility in either or both of the memory array banks 208. MTJ-based antifuse blocks 206 may be used to program read/write bias levels, timing, and/or redundancy mapping, for example. Isolated voltage supplies (bank and bias supplies 202) may be used for better noise isolation. For peak read and write bandwidth of up to, e.g., 400 MB/s, the xSPI interface 212 may drive the two memory array banks 208 independently, managing the overlap timing as needed in different serial (single, dual, quad, octal) modes.

Accordingly, a controller (not shown in FIG. 2) may output an erase operation command prior to a program or write operation, and/or as part of a program or write operation. Based on the erase operation command, the xSPI interface 212, the memory array bank 208-1, and/or the memory array bank 208-2 may provide the erase bit value register bit (i.e., an erase bit value) stored therein. Based on the erase bit value register bit, data in one or more addressed space(s) may be replaced (e.g., with 0 states or 1 states). A write and/or program command may be performed after the addressed space(s) are replaced during the erase operation.

The optional erase operation supported by the xSPI MRAM device 200 disclosed herein may allow compatibility with existing serial NOR controllers. For example, although an erase operation is not required to write to or program the xSPI MRAM device 200 disclosed herein, an existing serial NOR controller configured to output an erase command may be operable with the xSPI MRAM device 200 disclosed herein. Such a controller may output an erase command and the xSPI MRAM device 200 may perform an erase operation based on the erase bit value register bit disclosed. Additionally, or alternatively, certain aspects disclosed herein may provide additional security where a portion of memory can be erased to either state 0 or 1, based on an erase command.

Alternatively, as disclosed herein, a controller may not apply (e.g., may skip or determine to not perform) an erase command and, instead, may use program or write commands without any erase operation, to reduce write energy and/or write time compared to serial NOR devices using erase plus program commands.

Serial interface memory products may use low pin counts with chip select (CS\), clock (CK), and 1 to 8 IOs with data strobe (DS). High bandwidth may be achieved with single transfer rate (STR) or double (data at both clock edges) transfer rate (DTR).

Figure 3:
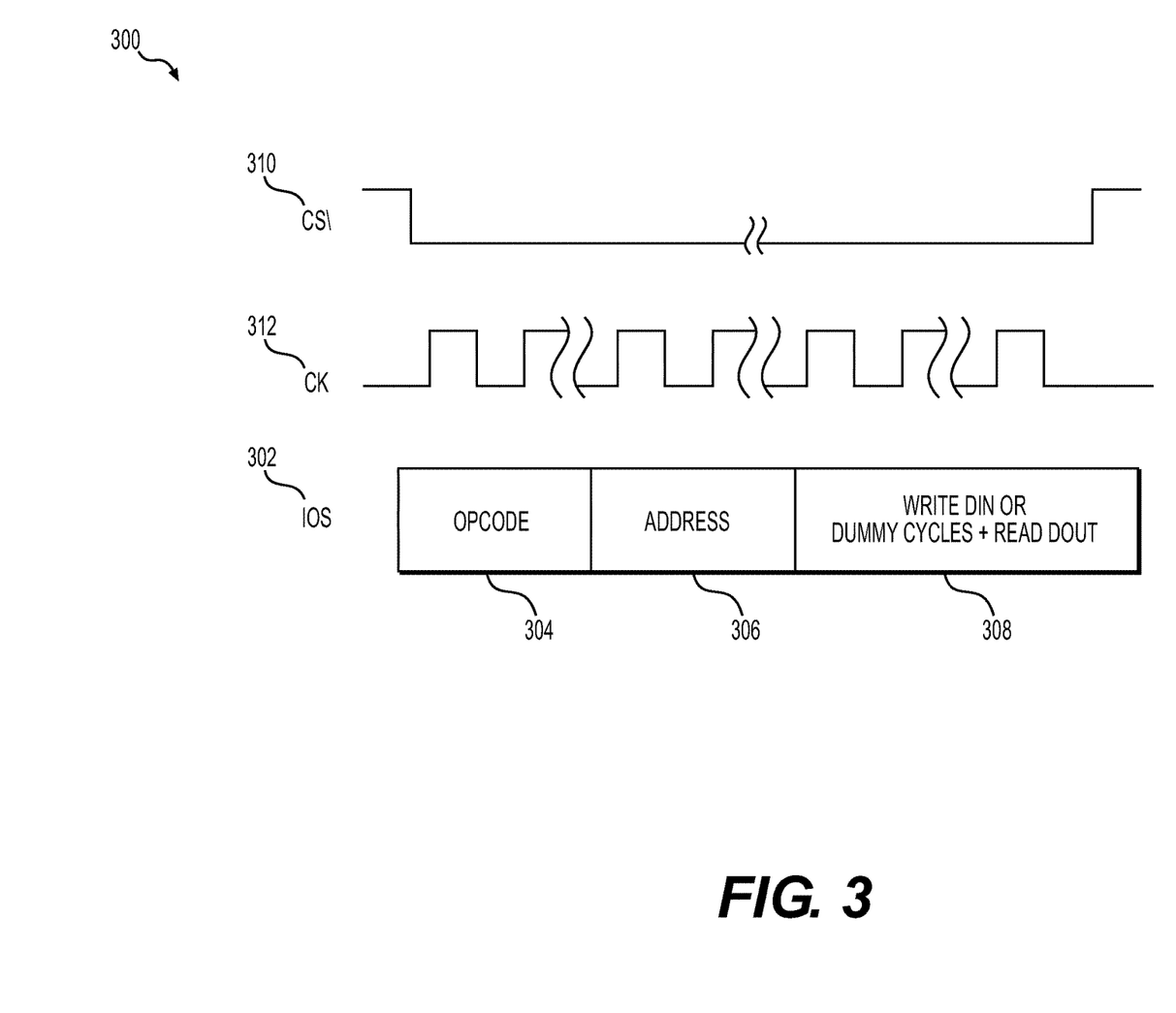
FIG. 3 depicts an exemplary signal protocol for read and/or write operations of the xSPI MRAM device of FIG. 2, according to an aspect of the disclosure.

FIG. 3 depicts an exemplary signal protocol 300 for read and/or write operations of the xSPI MRAM device of FIG. 2, according to an aspect of the disclosure. For example, FIG. 3 illustrates the signal protocol 300 for typical read and/or write where an, e.g., 8-bit command opcode 304 may be followed by an address 306 and a data stream 308 as IOs 302. FIG. 3 also illustrates, e.g., the CS\ (at 310) and CK (at 312) for the signal protocol 300. Internal memory array read and/or write operations may occur in real-time during the data stream portion of the protocol in serial SRAM due to fast internal access capability. However, serial NOR products may have asymmetric read and/or write operations and timing where internal reads may occur in real-time, but internal writes may operate on a page buffer (e.g., 2K or 4K bits) while the CS\ at 310 is low. NOR memory array writes may occur after the CS\ at 310 is brought into a high state in FIG. 3 during when a busy status (typically hundreds of micro seconds) is flagged. Through chip architecture and array circuit aspects disclosed herein, certain embodiments disclosed here may perform real-time MRAM array read and/or write operations like serial SRAM.

Figure 4A:
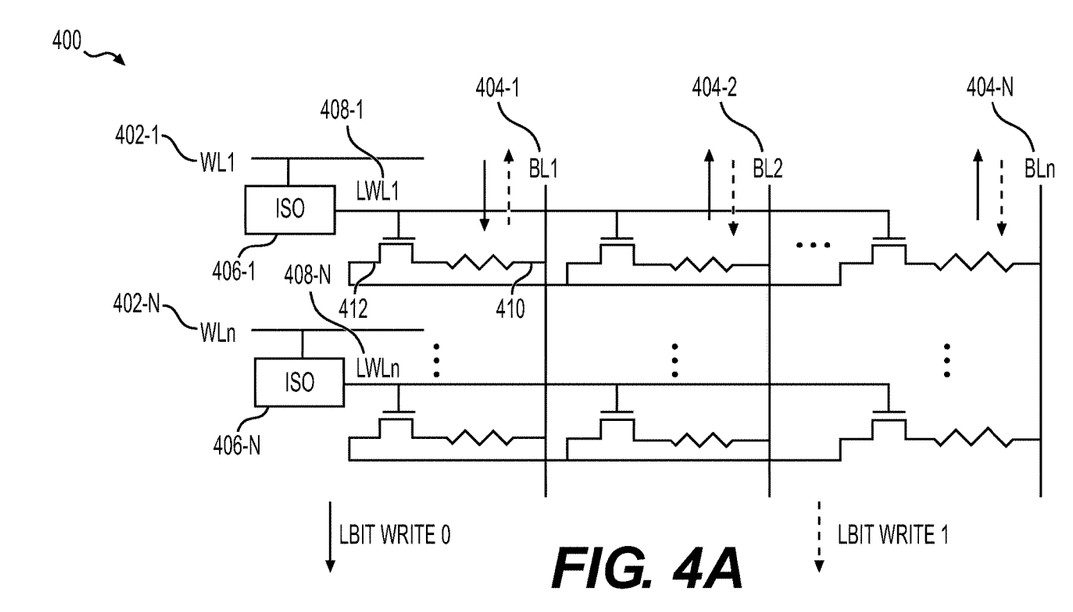
FIG. 4A depicts an exemplary local sourceline array with write current flow direction and return paths, according to an aspect of the disclosure.

FIG. 4A depicts an exemplary local sourceline array 400 with write current flow direction and return paths, according to an aspect of the disclosure. The local sourceline array 400 includes various wordlines (WLs) 402 (e.g., WL1 as WL 402-1 through WLn as WL 402-N), various bitlines (BLs) 404 (e.g., BL1 as BL 404-1 through BLn as BL 404-N), various isolated switches (ISOs) 406 (e.g., ISO 406-1 through ISO 406-N), and various local wordlines (LWLs) 408 (e.g., LWL1 as 408-1 through LWLn as LWL 408-N). As further illustrated in FIG. 4A, the local sourceline array 400 may include, for each BL 404, an MTJ 410 connected to the BL 404 and a transistor 412, where the transistor 412 is connected to the LWL 408. In this way, a local sourceline along the row direction may be used to connect a small group of MTJs and distribute the return current among the unselected BLs 404. The MTJ group size of, e.g., 32 BLs 404 may help to ensure that no disturbance occurs in the unselected BLs 404. For return current paths illustrated with write 0 and write 1 in FIG. 4A, the WL 402-1 may be the selected wordline, the BL 404-1 may be the selected bitline, and the BL 404-2 through the BL 404-N may be the return current paths. Furthermore, a LWL 408 for the same group of local sourceline MTJs 410 may be connected through ISO 406 to the WL 402 in the row direction.

Figure 4B:
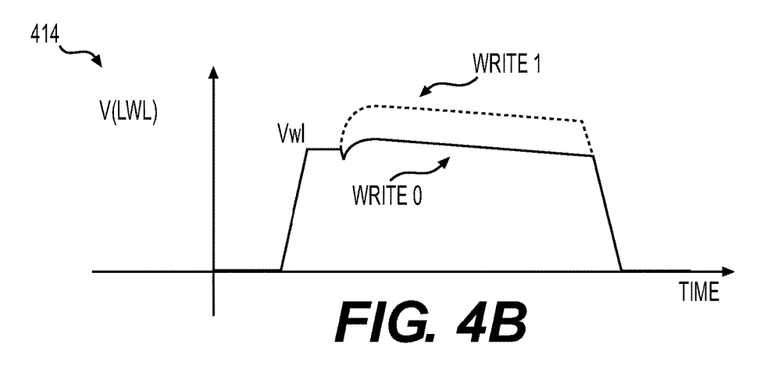
FIG. 4B depicts a graphical plot of a local wordline (LWL) voltage level in a selected row during a write operation of the xSPI MRAM device of FIG. 2, according to an aspect of the disclosure.

FIG. 4B depicts a graphical plot 414 of a LWL 408 voltage level in a selected row during a write operation of the xSPI MRAM device 200 of FIG. 2, according to an aspect of the disclosure. For example, FIG. 4B illustrates an exemplary LWL 408 auto-boot. When BLs 404 are at ground as in a standby mode, the voltage of the LWL 408 (V(LWL)) may reach a voltage WL (Vwl) level where Vwl may be the desired LWL 408 voltage level prior to applying write voltages across the BLs 404. Subsequently, the LWLs 408 may be isolated from the WL 402 and the Vwl level may be auto-booted to a higher level depending on write 1 or write 0 voltage application on the BLs 404. LWL 408 auto-boot may occur due to coupling from the select transistors 412 in a local sourceline group. This scheme may allow for concurrent writing of 0 or 1 states or write-inhibit to local sourceline groups along the same row and may avoid any need for BL 404 elevation to a write-inhibited local sourceline group.

Figure 5:
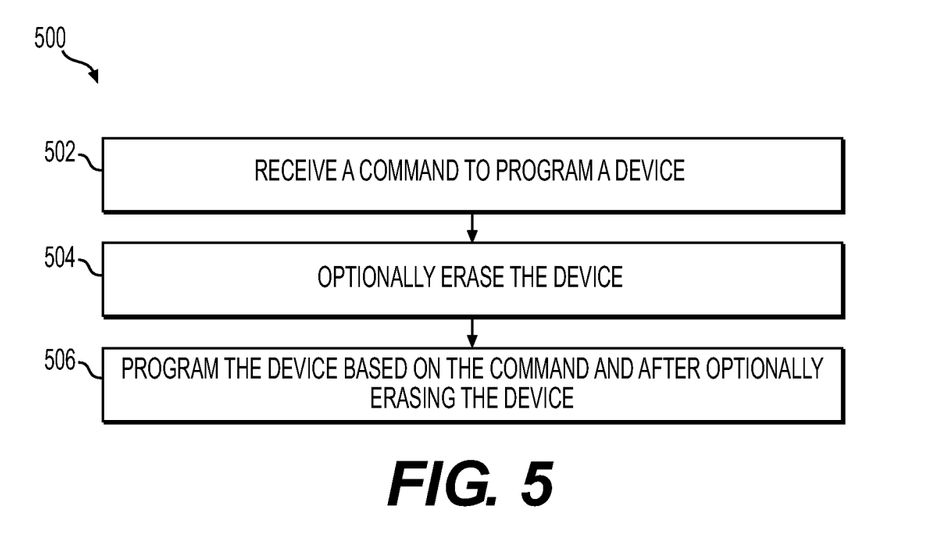
FIG. 5 depicts a flowchart for an exemplary method for programming the xSPI MRAM device of FIG. 2, according to an aspect of the disclosure.

FIG. 5 depicts a flowchart for an exemplary method 500 for programming the xSPI MRAM device 200 of FIG. 2, according to an aspect of the disclosure. The method 500 may be implemented in a controller in a microprocessor, microcontroller, or System-on-a-Chip (SoC) connected to the xSPI MRAM device 200. The method 500 may program one or more memory array banks 208 of the xSPI MRAM device 200.

The method 500 may include, at step 502, receiving a command to program a device. For example, a controller associated with an xSPI MRAM device 200 may receive a command to program the one or more memory array banks 208 of the xSPI MRAM device 200 (e.g., program the one or more memory array banks 208 with a 0 value or a 1 value). The controller may receive the command from one or more other elements of a microprocessor, microcontroller, or SoC depending on what application is being executed by a user.

The method 500 may include, at step 504, optionally erasing the device. For example, the controller may optionally erase the xSPI MRAM device 200. In some embodiments, the optional erasing at the step 504 may include erasing the xSPI MRAM device 200 after receiving the command or may include not erasing the xSPI MRAM device 200 after receiving the command. If the method 500 includes erasing the xSPI MRAM device 200, the method 500 may include erasing the one or more of the memory array banks 208 after receiving the command. As discussed above, based on the erase bit value register bit stored in the xSPI interface and/or memory array bank(s), data in one or more addressed space(s) may be replaced (e.g., with 0 states or 1 states). If the method 500 does not include erasing the xSPI MRAM device 200, the method 500 may proceed to the step 506 after the step 502 without performing an erase operation. The controller may determine to program the xSPI MRAM device 200 without performing an erase operation when the performance or operation time is critical, such as random access in a static random access memory (SRAM)-type application. In some embodiments, where an erase operation is needed, the controller may determine to program the xSPI MRAM device 200, after performing an erase operation, to emulate NOR Flash memory. The controller may further determine to perform an erase operation to securely erase the xSPI MRAM device 200 such that the erased data can no longer be accessed.

The method 500 may include, at step 506, programming the device based on the command and after optionally erasing the device. For example, the controller may program the one or more memory array banks 208 of the xSPI MRAM device 200. The programming of the xSPI MRAM device 200 may occur either after erasing the one or more memory array banks 208 or after receiving the command at the step 502 without erasing the one or more memory array banks 208. In certain embodiments, the one or more memory array banks 208 may apply one or more voltages to circuitry of the xSPI MRAM device 200 to perform the programming at step 506, as described in more detail elsewhere herein, e.g., in connection with FIGS. 4A and 4B. For example, the one or more memory array banks 208 may apply a set of voltages to a WL 402, a BL 404, and/or a LWL 408 to write either a 0 value or a 1 value to the one or more memory array banks 208. Additionally, or alternatively, the one or more memory array banks 208 may control the voltage levels on the BL 404 to facilitate writing of the 0 value or the 1 value.

Figure 6:
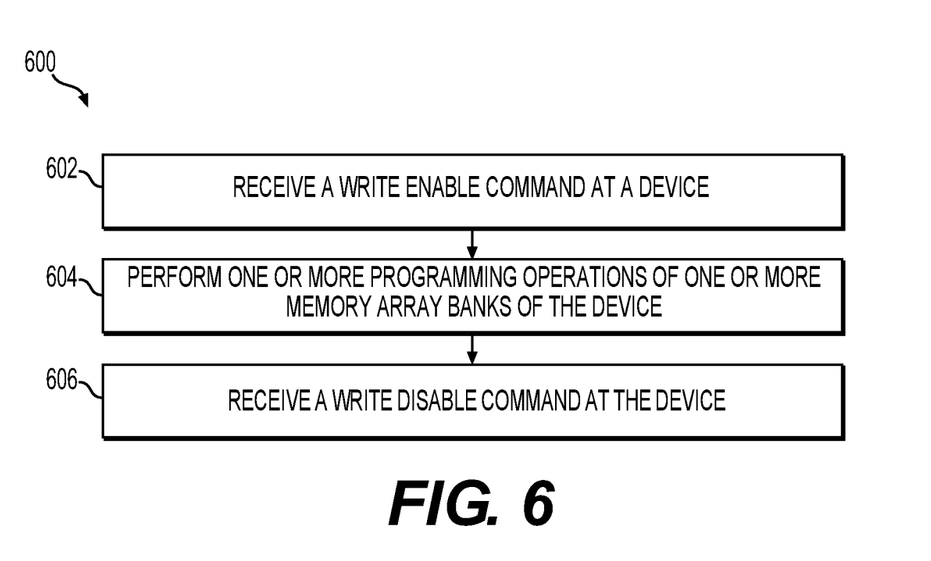
FIG. 6 depicts a flowchart for an exemplary method for controlling write operations of the xSPI MRAM device of FIG. 2, according to an aspect of the disclosure.

FIG. 6 depicts a flowchart for an exemplary method 600 for controlling write operations of the xSPI MRAM device 200 of FIG. 2, according to an aspect of the disclosure. For example, the method 600 may use write enable commands to control the write operations.

The method 600 may include, at 602, receiving a write enable command at a device. For example, a controller associated with an xSPI MRAM device 200 may receive the write enable command. The write enable command may configure the controller to perform write or programming operations for one or more memory array banks 208 of the xSPI MRAM device 200. For example, the controller may be prevented from writing or programming the memory array banks 208 until the write enable command is received. The write enable command may be received from the microprocessor, microcontroller, or SoC connected to the xSPI MRAM device 200.

In certain embodiments, the method 600 may include receiving a single write enable command for one or more write or programming operations. For example, the controller may receive a single write enable command for multiple write or programming operations rather than receiving a write enable command for each write or programming operation to be performed. This may conserve resources that would otherwise be consumed sending and receiving a write enable command for each write or programming operation to be performed. In addition, this may reduce latency associated with performing one or more write or programming operations by reducing or eliminating a need to process a write enable command for each of the write or programming operations.

The method 600 may include, at step 604, performing one or more programming operations of one or more memory array banks of the device. For example, the controller may write a 0 value or a 1 value to the one or more memory array banks 208, in a manner similar to that described elsewhere herein. The one or more programming operations may be similar to the programming performed at the step 506 of the method 500 of FIG. 5.

In certain embodiments, the controller may perform multiple write or programming operations after receiving the write enable command. For example, the controller may perform the write or programming operations after receiving a single write enable command at step 602. Continuing with the previous example, the controller may perform multiple write or programming commands after receiving the single write enable command.

The method 600 may include, at 606, receiving a write disable command at the device. For example, the controller may receive a write disable command for the xSPI MRAM device 200, e.g., in a manner similar to that described elsewhere herein. The write disable command may configure the controller to be prevented from performing write or programming operations. In certain embodiments, the controller may receive a single write disable command. For example, after performing multiple write or programming operations, the controller may receive a single write disable command to configure the controller to stop writing or programming the one or more memory bank arrays 208 and/or to prevent the controller from performing additional write or programming operations (e.g., rather than receiving a write disable command for each write or programming operation). Receiving a single write disable command for multiple write or programming operations may conserve resources that would otherwise be consumed receiving and processing a write disable command for each write or programming operation that is performed. In addition, this may reduce latency associated with performing one or more write or programming operations by reducing or eliminating steps that need to be performed between write or programming operations.

Although the methods 500 and 600 are described with respect to two flowcharts, the methods 500 and 600 may be combined in some implementations. For example, a combined method may include receiving the command to program the device at step 502, optionally erasing the device at step 504, receiving the write enable command at step 602, programming the device at steps 504 and/or 604, and receiving the write disable command at step 606.

In this way, certain embodiments described herein may provide various technical advantages. For example, fast (e.g., sub-20 nanosecond (ns)) write pulse width and two memory array bank 208 architecture with concurrent write 0 and write 1 may facilitate RAM-like persistent memory operation in the xSPI MRAM device 200 design. Data may be directly written to the MRAM array during the data stream phase 308 of the serial command protocol 300, as illustrated in FIG. 3. Therefore, write time may be a function of single, dual, quad, and octal 10 modes and single or dual transfer rate set in the xSPI configuration register (e.g., similar to the config register 105). The xSPI configuration register may further contain a write mode bit to emulate NOR Flash program mode for, e.g., 256-byte page buffer. When the bit is set, the program/write address may wrap around in the address space for, e.g., 256 bytes of data emulating NOR Flash programming as if a, e.g., 256-byte page buffer existed. Additionally, or alternatively, erase commands may also be supported, but optional, in the xSPI interface 212 for compatibility with serial flash protocol. Additionally, or alternatively, certain embodiments described herein may not need write-verify. Thus, MRAM write time may be several orders of magnitude better compared to certain NOR devices. Furthermore, certain embodiments may provide for several orders of magnitude write energy improvement over certain NOR devices at target IDD, or active current draw from power supply (VDD) of the xSPI MRAM device 200 and at a certain throughput.

In one embodiment, a method for programming a memory device comprising a plurality of memory arrays may include receiving a command to program one or more of the plurality of memory arrays; and programming the one or more of the plurality of memory arrays based on the command, wherein the method optionally includes erasing the one or more of the plurality of memory arrays prior to the programming.

Various embodiments of the method may include: erasing the one or more of the plurality of memory arrays after receiving the command, wherein the programming of the one or more of the plurality of memory arrays further comprises: programming the one or more of the plurality of memory arrays after erasing the one or more of the plurality of memory arrays; the programming of the one or more of the plurality of memory arrays further comprises: programming the one or more of the plurality of memory arrays without erasing the one or more of the plurality of memory arrays prior to the programming; the memory device comprises an expanded serial peripheral interface (xSPI) magnetoresistive random-access memory (MRAM) device; the memory device further comprises: a bias system connected to the plurality of memory arrays, an error correction code datapath corresponding to each of the plurality of memory arrays, and an interface; the bias system comprises one or more magnetoresistive device anti-fuse blocks; the interface is connected to the one or more magnetoresistive device anti-fuse blocks; the bias system is connected to an array supply or a bias supply; the interface is connected to an interface supply and one or more inputs or outputs of the memory device; the method further comprising receiving a write enable command at the memory device prior to programming the one or more of the plurality of memory arrays; and receiving a write disable command at the memory device after programming the one or more of the plurality of memory arrays.

In another embodiment, a memory device may include a plurality of memory arrays, the memory device being configured to: receive a command to program one or more of the plurality of memory arrays; and program the one or more of the plurality of memory arrays based on the command, wherein the memory device is configured to optionally erase the one or more of the plurality of memory arrays prior to the programming.

Various embodiments of the memory device may include: the method device further configured to: erase the one or more of the plurality of memory arrays after receiving the command, wherein the memory device is further configured, when programming the one or more of the plurality of memory arrays, to: program the one or more of the plurality of memory arrays after erasing the one or more of the plurality of memory arrays; the memory device is further configured, when programming the one or more of the plurality of memory arrays, to: program the one or more of the plurality of memory arrays without erasing the one or more of the plurality of memory arrays prior to the programming; the memory device further includes: a bias system connected to the plurality of memory arrays, an error correction code datapath corresponding to each of the plurality of memory arrays, and an interface; the bias system comprises one or more magnetoresistive device anti-fuse blocks; the interface is connected to the one or more magnetoresistive device anti-fuse blocks; the bias system is connected to an array supply or a bias supply; the interface is connected to an interface supply and one or more inputs or outputs of the memory device; the memory device further configured to: receive a write enable command at the memory device prior to programming the one or more of the plurality of memory arrays; and receive a write disable command at the memory device after programming the one or more of the plurality of memory arrays.

In another embodiment, a method for programming a memory device comprising a plurality of memory arrays may include: receiving a write enable command at the memory device; receiving a command to program one or more of the plurality of memory arrays; performing one or more programming operations for the one or more of the plurality of memory arrays after receiving the write enable command, wherein the method optionally comprises erasing the one or more of the plurality of memory arrays prior to performing the one or more programming operations; and receiving a write disable command at the memory device after performing the one or more programming operations.

The foregoing description of the inventions has been described for purposes of clarity and understanding. It is not intended to limit the inventions to the precise form disclosed. Various modifications may be possible within the scope and equivalence of the application.

We claim:

1. A method for programming a memory device comprising a plurality of memory arrays and a non-volatile erase bit value register, the method comprising:

receiving a command to program one or more of the plurality of memory arrays; and programming the one or more of the plurality of memory arrays based on the command, wherein the method comprises optionally erasing the one or more of the plurality of memory arrays prior to the programming, wherein the optionally erasing the one or more of the plurality of memory arrays comprises:

if a performance or an operation time is critical, assigning an erase bit value in the erase bit value register a first state, or if the performance or operation time is not critical, assigning the erase bit value in the erase bit value register a second state; and receiving the erase bit value from the erase bit value register, wherein, when the erase bit value is in the first state, an optional erase command is activated such as to erase the one or more of the plurality of memory arrays, and, when the erase bit value is in the second state, an optional erase command is not activated such as not to erase the one or more of the plurality of memory arrays.

2. The method of claim 1, further comprising:

erasing the one or more of the plurality of memory arrays after receiving the command, wherein the programming of the one or more of the plurality of memory arrays further comprises:

programming the one or more of the plurality of memory arrays after erasing the one or more of the plurality of memory arrays.

3. The method of claim 1, wherein the programming of the one or more of the plurality of memory arrays further comprises:
programming the one or more of the plurality of memory arrays without erasing the one or more of the plurality of memory arrays prior to the programming.

4. The method of claim 1, wherein the memory device comprises an expanded serial peripheral interface (xSPI) magnetoresistive random-access memory (MRAM) device.

5. The method of claim 1, wherein the memory device further comprises:
a bias system connected to the plurality of memory arrays,
an error correction code datapath corresponding to each of the plurality of memory arrays, and
an interface.

6. The method of claim 5, wherein the bias system comprises one or more magnetoresistive device anti-fuse blocks.

7. The method of claim 6, wherein the interface is connected to the one or more magnetoresistive device anti-fuse blocks.

8. The method of claim 5, wherein the bias system is connected to an array supply or a bias supply.

9. The method of claim 5, wherein the interface is connected to an interface supply and one or more inputs or outputs of the memory device.

10. The method of claim 1, further comprising:
receiving a write enable command at the memory device prior to programming the one or more of the plurality of memory arrays; and
receiving a write disable command at the memory device after programming the one or more of the plurality of memory arrays.

11. A memory device, comprising:
a plurality of memory arrays and a non-volatile erase bit value register, wherein the memory device includes:
a bias system connected to the plurality of memory arrays, wherein the bias system comprises one or more magnetoresistive device anti-fuse blocks;
an error correction code datapath corresponding to each of the plurality of memory arrays; and
an interface, wherein the interface is connected to the one or more magnetoresistive device anti-fuse blocks, and
wherein the memory device is configured to:
receive a command to program one or more of the plurality of memory arrays; and
program the one or more of the plurality of memory arrays based on the command, wherein the memory device is configured to optionally erase the one or more of the plurality of memory arrays prior to the programming,
wherein the optionally erasing the one or more of the plurality of memory arrays comprises:
if a performance or an operation time is critical, assigning an erase bit value in the erase bit value register a first state, or
if the performance or operation time is not critical, assigning the erase bit value in the erase bit value register a second state; and
receiving the erase bit value from the erase bit value register, wherein, when the erase bit value is in the first state, an optional erase command is activated such as to erase the one or more of the plurality of memory arrays, and, when the erase bit value is in the second state, an optional erase command is not activated such as not to erase the one or more of the plurality of memory arrays.

12. The memory device of claim 11, further configured to:
erase the one or more of the plurality of memory arrays after receiving the command,
wherein the memory device is further configured, when programming the one or more of the plurality of memory arrays, to:
program the one or more of the plurality of memory arrays after erasing the one or more of the plurality of memory arrays.

13. The memory device of claim 11, wherein the memory device is further configured, when programming the one or more of the plurality of memory arrays, to:
program the one or more of the plurality of memory arrays without erasing the one or more of the plurality of memory arrays prior to the programming.

14. The memory device of claim 11, wherein the interface is connected to an interface supply and one or more inputs or outputs of the memory device.

15. The memory device of claim 11, further configured to:
receive a write enable command at the memory device prior to programming the one or more of the plurality of memory arrays; and
receive a write disable command at the memory device after programming the one or more of the plurality of memory arrays.

16. A method for programming a memory device comprising a plurality of memory arrays, the method comprising:
receiving a write enable command at the memory device, wherein the memory device includes:
a bias system connected to the plurality of memory arrays, wherein the bias system comprises one or more magnetoresistive device anti-fuse blocks;
an error correction code datapath corresponding to each of the plurality of memory arrays; and
an interface, wherein the interface is connected to the one or more magnetoresistive device anti-fuse blocks;
performing one or more programming operations for one or more of the plurality of memory arrays after receiving the write enable command, wherein the method comprises optionally erasing the one or more of the plurality of memory arrays prior to the performing the one or more programming operations;
wherein the erasing the one or more of the plurality of memory arrays comprises:
if a performance or an operation time is critical, assigning an erase bit value in an erase bit value register a first state, or
if the performance or operation time is not critical, assigning the erase bit value in the erase bit value register a second state; and
receiving the erase bit value from the erase bit value register, wherein, when the erase bit value is in the first state, an erase command is activated such as to erase the one or more of the plurality of memory arrays, and, when the erase bit value is in the second state, an optional erase command is not activated such as not to erase the one or more of the plurality of memory arrays; and
receiving a write disable command at the memory device after performing the one or more programming operations; and
after programming the one or more of the plurality of memory arrays, receiving a write disable command at the memory device.

* * * * *